United States Patent [19]
Segaram

[11] Patent Number: 4,954,785
[45] Date of Patent: Sep. 4, 1990

[54] AUTO TRACKING NOTCH FILTER USING SWITCHED CAPACITORS TO MEASURE HARMONIC DISTORTION AND NOISE CONTAINED IN A SIGNAL SOURCE

[75] Inventor: Para Segaram, Campbell, Calif.
[73] Assignee: Sundstrand Corporation, Rockford, Ill.
[21] Appl. No.: 337,082
[22] Filed: Apr. 12, 1989
[51] Int. Cl.⁵ .................... H03B 1/04; H03H 7/12
[52] U.S. Cl. .................... 328/167; 328/140; 307/521; 333/174
[58] Field of Search ............... 307/520, 521; 328/140, 328/151, 167; 333/173, 174, 17

[56] References Cited
U.S. PATENT DOCUMENTS

| | | | |
|---|---|---|---|
| 3,562,675 | 2/1971 | Urell | 333/17 |
| 3,638,037 | 1/1972 | McMurtrie | 307/233 |
| 3,946,328 | 3/1976 | Boctor | 307/521 |
| 3,978,416 | 8/1976 | Sutphin, Jr. | 328/167 |
| 4,316,108 | 2/1982 | Rogers, Jr. | 307/521 |
| 4,496,859 | 1/1985 | Crooks | 307/520 |
| 4,679,001 | 7/1987 | West | 328/167 |

Primary Examiner—Stanley D. Miller
Assistant Examiner—Hanh T. Nguyen
Attorney, Agent, or Firm—Antonelli, Terry, Stout & Kraus

[57] ABSTRACT

A tunable filter (66) having a filter characteristic tracking an input signal in accordance with the invention includes a signal source (18) providing a variable frequency signal to be tracked by the filter characteristic; a frequency detector (62) coupled to the signal source for producing a detector output signal which is a function of the frequency of the variable frequency signal; a switching signal generator (64), responsive to the frequency detector output signal, for generating at least one switching signal having a variable frequency proportional to the detector output signal; a first capacitor (112, 126, 150, 152, 156 and 158) having a first terminal coupled to a reference potential and a second terminal; and a first switching circuit (114, 128, 154 and 160) having an input coupled to the variable frequency signal, responsive to the at least one switching signal, and in response to changes in level of the at least one switching signal alternately connecting the input of the first switching circuit to the second terminal of the first capacitor and the second terminal of the first capacitor to the output of the first switching circuit coupled to an output of the filter.

32 Claims, 6 Drawing Sheets

AUTO TRACKING NOTCH FILTER USING SWITCHED CAPACITORS TO MEASURE HARMONIC DISTORTION AND NOISE CONTAINED IN A SIGNAL SOURCE

Technical Field

The present invention relates to tunable filters which track an input signal source. Additionally, the invention relates to systems for detecting malfunctions of inverter power transistor switches in airframe power supplies.

Background Art

FIG. 1 illustrates a prior art airframe power supply system in which three phase 400 Hz. electrical power is generated by an inverter. This system is utilized in a variable speed constant frequency (VSCF) power generating system in the F18 aircraft. The power generating system 10 has a variable frequency three phase alternator 12 which receives a power takeoff 14 from an airframe propulsion engine to produce three phase variable frequency output current. The three phase output current is applied to a three phase full-wave rectifier 16 which produces a DC output. The DC output from the three phase full-wave rectifier 16 is applied to a three phase inverter 18 which electronically switches the positive and negative potentials provided by the three phase rectifier 16 to generate three phase 400 Hz. power which is applied to various appliances in the airframe. The power transistor switches present in the three phase inverter 18 are subject to malfunction which when present produces substantial third high order and higher harmonics of the basic 400 Hz. power. Furthermore, because aircrafts prior to takeoff are subject to receiving external power from sources such as a ground cart or the aircraft auxiliary power unit, neither of which do not have a precisely regulated frequency, power applied to the airframe during ground operation is subject to variation such as a ±20 Hz. During ground operation, when external power is applied, the external power is coupled directly to the power bus output 20 of the airframe to provide power directly to the appliances of the aircraft. A static high pass filter 22 is coupled to the power bus 20 and to the connector for connection to the external power source. The static high pass filter 22 is a fourth order filter tuned to pass third or higher harmonics of the basic 400 Hz. power output and sharply attenuate frequencies centered around 400 Hz. The passing of significant energy in third or higher harmonics by the static high pass filter 22 is indicative of a malfunction of the power switches in the three phase inverter 18.

The static high pass filter 22 is comprised of discrete components which represent a weight penalty in an aircraft. Furthermore, discrete components are subject to change in values as a consequence of heat and aging which can cause the characteristic of the filter to vary. Given the fact that airframe specifications require that the static high pass filter 22 must not pass significant energy of third order and higher harmonics of the regulated 400 Hz. power source when external power sources which are subject to frequency variation are powering the airframe, a fourth order filter was required to avoid false indications of inverter power switches when external power sources are attached.

The output of the static high pass filter 22 is processed to develop a shutdown signal when significant energy in third and higher order harmonics is present which is applied to the three phase inverter 18 to remove it from operation. The output signal from the static high pass filter 22 is applied to a full-wave rectifier 24 which rectifies the energy present in passed third or higher harmonics. The output signal from the full-wave rectifier 24 is applied to a low pass filter 26 which develops a DC output signal which is applied to analog to digital converter 28. The digital output signal output signal from the analog to digital converter 28 is applied to microprocessor controller 30 which compares the magnitude encoded by the digital signal with a stored reference magnitude which when exceeded is indicative of a malfunction of the three phase inverter 18 as a consequence of significant energy being present in third or higher harmonics of the output power produced by the inverter. The microprocessor controller 30 generates the shutdown signal in response to a comparison of the stored magnitude signal with the output of the analog to digital converter 28 exceeding the stored value. The microprocessor controller 30 also performs other functions such as frequency regulation to produce precisely regulated 400 Hz. electrical power and phasing if multiple inverters are being operated.

FIG. 2 illustrates a prior art first order low pass filter 40 which is based upon timed switching of a first capacitor 42 and a second capacitor 44 which each have first terminals coupled to a reference potential. The input voltage is applied to a first switch 46 which alternately switches between conductive and non-conductive states under the control of a first switching signal $\Phi 1$ applied to a control terminal thereof to alternatively connect the voltage Vin to the first capacitor 42 and to open circuit Vin from the first capacitor 42. The second switch 48 has a first terminal coupled to the second terminal of the first capacitor 42 and a second terminal coupled to a second terminal of the second capacitor 44 and to the output Vout. The conductivity of the second switch 48 is alternately switched between conductive and non-conductive states to alternately connect the second terminal of the first capacitor 42 to the second terminal of the second capacitor 44 and Vout and to open circuit the second terminal of the first capacitor from the second terminal of the second capacitor. The control signals $\Phi 1$ and $\Phi 2$ are the inverse of each other such that at any point in time only one of the switches 46 and 48 will be conductive.

FIG. 3 illustrates the response characteristic of the low pass filter of FIG. 2. The filter 40 operates by charging the small capacitor 42 to the input voltage, then distributing this charge between the small and large capacitor 44. During successive switching operations, the voltage on the capacitor 44 will gradually approach the input voltage until after infinite time, the two voltages are equal. The voltage increasing in steps as a function of switching cycles in FIG. 3 represents this increase of stored voltage on the capacitor 44. The corner frequency of the filter 40 is determined by the ratio of the capacitors 42 and 44 and the switching frequency. If the capacitor ratio is increased (capacitor 44 is made twice as large as the capacitor 42, as illustrated in FIG. 3), it takes twice the charge to bring the parallel combination of the capacitors 42 and 44 to a desired voltage than as illustrated in FIG. 3, therefore, the filter corner frequency is proportional to the ratio of the sum of the capacitance of the capacitors 42 and 44 to the capacitance of capacitor 42. With a fixed capacitance ratio, it takes a fixed number of switching cycles to produce a given output voltage as illustrated. If the switching frequency is halved, twice as much time will be required to obtain the desired number of switching cycles to cause the voltage to reach a desired level. Therefore, the filter corner frequency is also proportional to the switching frequency.

Tunable filters are known. For example, see U.S. Pat. Nos. 3,562,675, 3,638,037, 3,978,416, 4,316,108, 4,496,859 and 4,679,001.

Disclosure of Invention

The present invention provides an improved system for detecting malfunction of inverters in VSCF power supplies used in airframes. The invention utilizes a tunable notch filter for detecting the presence of significant energy in third or higher harmonics of the output power from the inverter power transistor switches to detect inverter power transistor switch malfunction and does not pass significant third order or higher harmonics of the variable frequency power supplied from external power sources such as ground carts or power generated by auxiliary power units. The invention is based upon integrated circuit techniques which permit components to be fabricated on the same substrate to minimize the effects of aging on the stability of the notch provided by the notch filter. Furthermore, the implementation of the notch filter of the present invention in integrated circuit components substantially lessens the weight of the filter as compared to the prior art discussed above with respect to FIG. 1.

Furthermore, the present invention provides a tunable filter in which the components used for tuning the filter characteristic are implemented in integrated circuit components which may be used for diverse applications such as, but not limited to, communications. The filter has a filter characteristic which tracks the frequency of an input signal applied to the filter. The characteristic of the filter may be designed to meet particular frequency response characteristics by providing a series connection of a plurality of stages each containing capacitors which are alternately switched between an input and an output or another capacitor which is connected to an output. The filter characteristic may be low pass, high pass or a notch. Higher order filters may be achieved by coupling stages in series. The control of the filter is based upon digital processing techniques which enable the filter to be readily used with programmed processors such as microprocessors.

A tunable filter having a filter characteristic tracking an input signal in accordance with the present invention includes a signal source providing a variable frequency signal to be tracked by the filter characteristic; a frequency detector, coupled to the signal source, for producing a detector output signal which is a function of the frequency of the variable frequency signal; a switching signal generator, responsive to the frequency detector output signal, for generating at least one switching signal having a variable frequency proportional to the detector output signal; a first capacitor having a first terminal coupled to a reference potential and a second terminal; a first switching circuit, having an input coupled to the variable frequency signal, responsive to the at least one switching signal, and in response to changes in level of the at least one switching signal alternately coupling the input of the first switching circuit to the second terminal of the first capacitor and coupling the second terminal of the first capacitor to an output of the first switching circuit coupled to an output of the filter. The output of the first switching circuit may be connected to an integrator. Furthermore, a second capacitor may be provided having a first terminal coupled to a reference potential and a second terminal, the first switching circuit coupling the output of the first switching circuit to the second terminal of the second capacitor which is coupled to an output of the filter when the second terminal of the first capacitor is coupled to the output of the first switching circuit. Furthermore, a third capacitor may be provided having a first terminal coupled to a reference potential and a second terminal; and a second switching circuit, having an input coupled to the variable frequency signal, responsive to the at least one switching signal, and in response to changes in level of the at least one switching signal alternately coupling the input of the second switching circuit to the second terminal of the third capacitor and the second terminal of the third capacitor to the output of the filter. The output of the filter may be coupled to an integrator. A negative feedback circuit may be coupled between an output of the integrator and the input of the second switching circuit.

The filter contains a series circuit having an input coupled to the signal source and an output which is the output of the filter. The series circuit contains the first and second switching circuits, the first, second and third capacitors, the integrator and the negative feedback circuit.

The signal source may be AC power on an airframe; and the filter may be a notch filter having a maximum attenuation point which tracks the AC power frequency. The invention further includes a three phase inverter for generating the AC power coupled to the filter, the inverter ceasing generating electrical power in response to a shutdown signal; a rectifier, responsive to an output of the notch filter for rectifying any signal frequencies passed by the filter; a comparator, for comparing the rectified signal frequencies with a reference magnitude and generating the shutdown signal if the rectified signal magnitude exceeds the reference magnitude, the shutdown signal being coupled to the three phase inverter.

The switching signal generator for generating the at least one switching signal generates first and second switching signals, the first and second switching signals each alternating between first and second levels and the second switching signal being an inverse of the first switching signal. A first switching circuit comprises first and second switches having conductivity states controlled by the first and second switching signals, the first switch having first, second and control terminals with the first terminal being connected to the second terminal in response to a first level of the first switching signal being applied to the control terminal and the first terminal being disconnected from the second terminal in response to the second level of the first switching signal being applied to the control terminal, the first terminal being coupled to the signal source and the second terminal being coupled to the second terminal of the first capacitor, the second switch having first, second and control terminals with the first terminal of the second switch being coupled to the second terminal of the first capacitor, the second terminal of the second switch being coupled to an output of the filter and the control terminal of the second switch being coupled to the second switching signal, the first terminal of the second switch being connected to the second terminal of the second switch in response to a first level of the second switching signal being applied to the control terminal of the second switch and the first terminal of the second switch being disconnected from the second terminal of the second switch in response to a second level of the second switching signal being applied to the control terminal of the second switch.

Furthermore in accordance with the invention, the first capacitor, the first switching circuit, the integrator and the negative feedback circuit are a stage of the filter and the filter contains a plurality of stages connected in series to form a multiple order filter with each stage having the first capacitor, the first switching circuit, the integrator and the negative feedback circuit.

Furthermore in accordance with the invention, the first capacitor, the second capacitor and the first switching circuit are a stage of the filter and the filter contains a plurality of stages connected in series to form a multiple order filter with each stage having the first and second capacitors and the first switching circuit.

Furthermore in accordance with the invention, the first capacitor, the second capacitor and the first switching circuit are a first stage of the filter; the third capacitor, the second switching circuit, the integrator and the negative feedback circuit are a second stage of the filter; and the filter contains a plurality of first stages and a plurality of second stages connected in series to form a multiple order filter.

The switching signal generator includes a clock for providing clock pulses; a counter, responsive to the clock and to the signal source, for counting a number of pulses occurring during at least a portion of the cycle of the variable frequency signal from the signal source with the pulses being synchronous with the clock pulses with the count being a function of the frequency of the variable frequency signal; a storage register, coupled to the counter, for storing the number of pulses counted during the at least a portion of a cycle of the variable frequency signal, a down counter, coupled to the storage register and to the clock, for cyclically loading the down counter with the stored count each time the down counter counts to zero and counting down in response to each clock pulse until zero is reached and producing the at least one switching signal in response to each time the down counter counts to zero. Furthermore, a logic circuit is provided, responsive to each zero count, for producing the first and second switching signals having a frequency determined by a frequency of the zero counts produced by the down counter with the second switching signal being an inversion of the first switching signal.

The counter for counting a number of clock pulses during at least a portion of a cycle of the variable frequency signal comprises a divider, responsive to the clock, for dividing the clock signal by an integer n to produce an output signal having a frequency which is equal to the clock frequency divided by n; and an up counter, responsive to the output signal of the divider, which is reset each time the predetermined at least a portion of a cycle of the variable frequency signal occurs and which counts the output pulses outputted by the divider during the predetermined at least a portion of the cycle of the variable frequency signal to generate the number of pulses stored by the storage register. Furthermore, a zero crossing detector is provided, responsive to the variable frequency signal, for producing an output signal having a period proportional to the frequency of the variable frequency signal, the up counter being set in response to the output signal from the zero crossing detector. Furthermore, a control signal generator is provided, coupled to the output signal from the zero crossing detector, for producing a control signal having one-half the frequency of the output from the comparator; the up counter being reset as a function of the control signal. A pulse generator is provided, responsive to the control signal, for producing an output pulse each time the control signal changes from a first level to a second level, the output pulse causing the storage of the count of the number of pulses in the storage and a gate is provided, having first, second and third inputs and an output, which resets the up counter, the first input being from the clock, the second input being the control signal, and the third input being from the pulse generator.

Best Mode for Carrying Out the Invention

Figure 1:
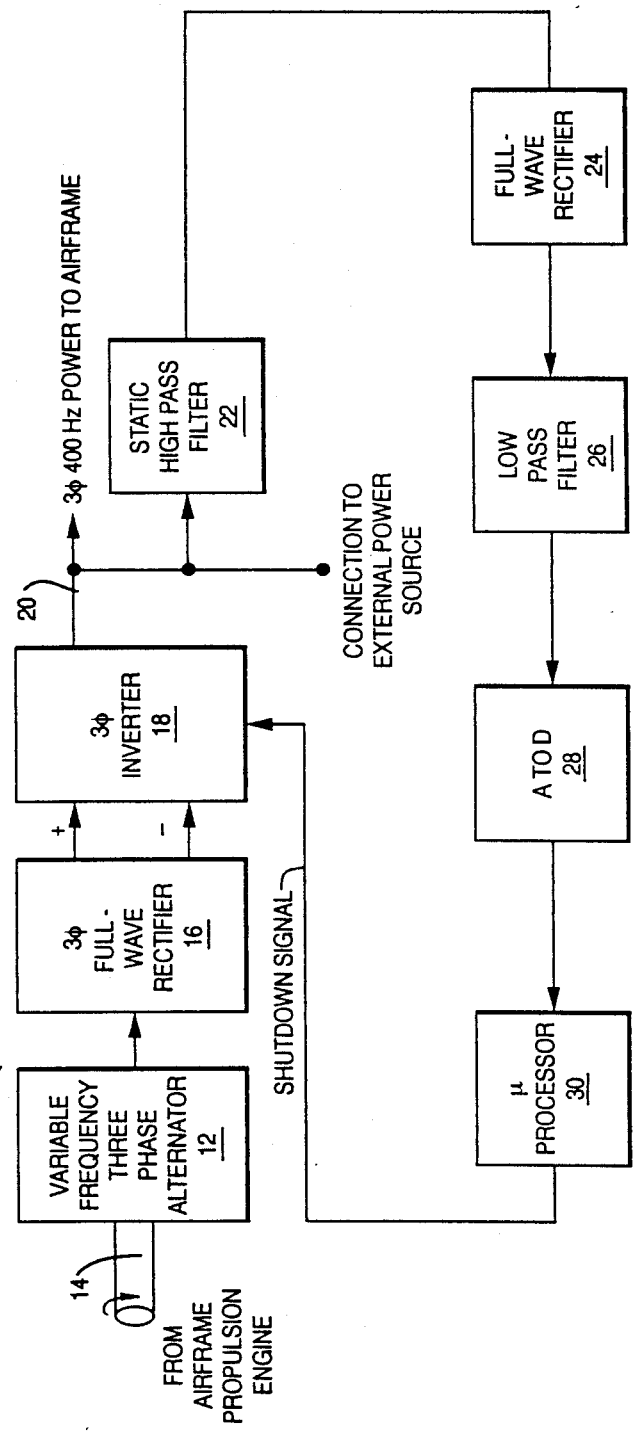
FIG. 1 illustrates a block diagram of a prior art system.
Figure 4:
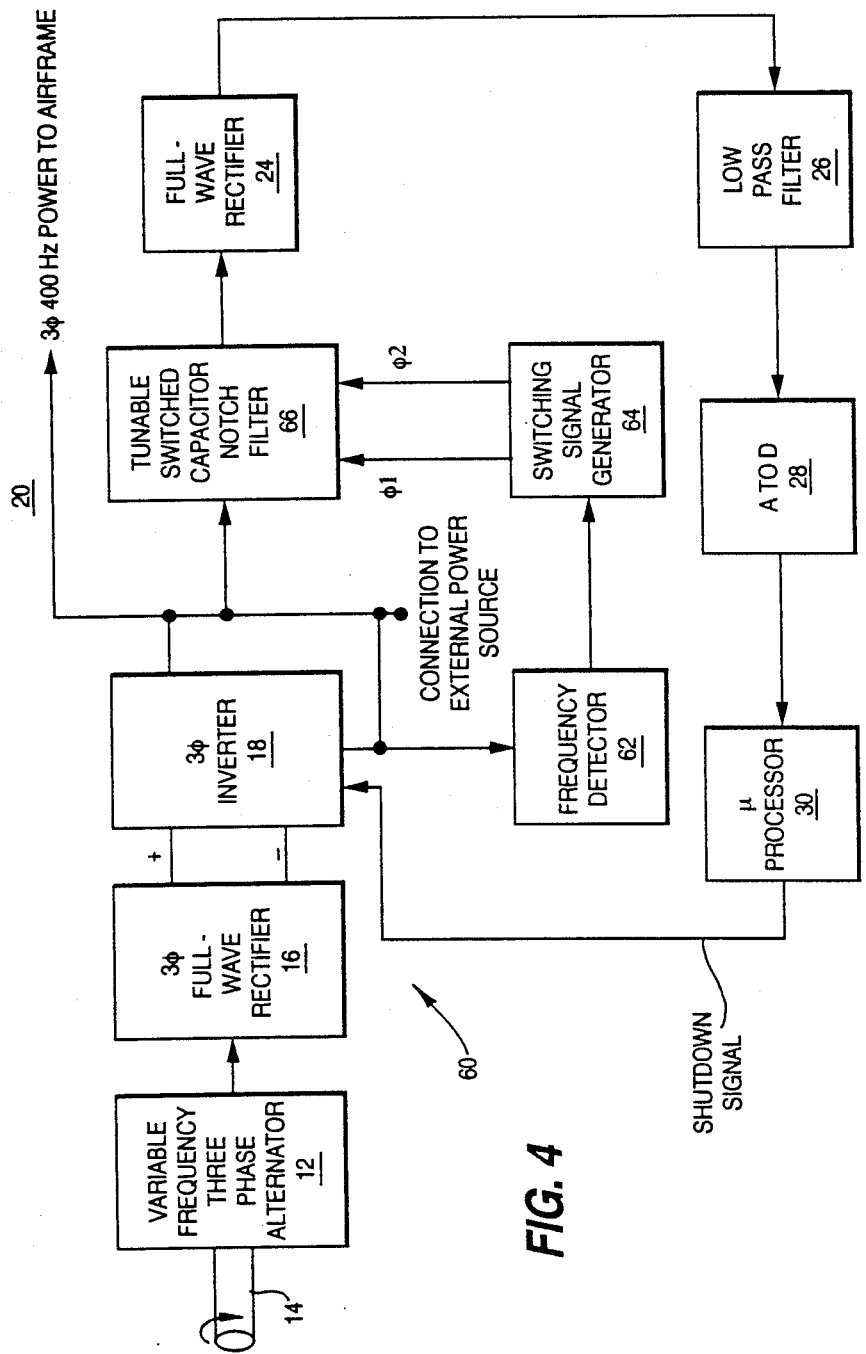
FIG. 4 illustrates a block diagram of a preferred embodiment of a tunable notch filter of the present invention used in a VSCF power generating system in an airframe.

FIG. 4 illustrates a block diagram of the present invention. Like reference numerals identify like parts in FIGS. 1 and 4. The overall operation of the embodiment 60 of the present invention illustrated in FIG. 4 is identical to the prior art illustrated in FIG. 1 in that the three phase inverter 18 is shut down in response to a SHUT DOWN SIGNAL produced by micro processor 30 upon the detection of significant third or higher harmonics present in the output from the three phase inverter 18. The VSCF system 60 of FIG. 4 includes a frequency detector 62 which detects the frequency of the power applied to the airframe either by the three phase inverter 18 or from the power source external to the airframe such as occurs during ground operation or from an auxiliary power unit. The frequency detector 62 outputs a signal which is proportional to the frequency of the power present on the airframe which is applied to a switching signal generator 64. The switching signal generator 64 generates a first switching signal $\Phi 1$ and a second switching signal $\Phi 2$ which are related such that $\Phi 2$ is an inversion of $\Phi 1$. The first switching signal $\Phi 1$ and the second switching signal $\Phi 2$ vary in frequency proportionally to the variation in frequency of the power present in the airframe from the three phase inverter 18 or from the external power source. Alternatively, the switching generator 64 may output a single switching signal having a frequency proportional to the frequency of the power on the airframe with the signal controlling an electronic single pole double throw switch as described below in conjunction with FIG. 7. A tunable switched capacitor notch filter 66, which is described in detail below in conjunction with FIGS. 6 and 7, functions to tune the maximum attenuation point of a notch filter to the frequency of the power present on the airframe such that the notch of the notch filter tracks the power frequency. Tuning of the notch precisely to the frequency of electrical power present on the airframe permits the filter to be implemented as a second order filter instead of as a fourth order filter in discrete components as described above with respect to the prior art while still being operational to not cause the generation of the SHUTDOWN SIGNAL with variation in frequency of the power on the airframe such as ±20 Hz. which occurs with power being applied from an external ground source or by the auxiliary power unit. The tunable switched notch filter 66 has a characteristic, as described below with reference to FIG. 5, which is sharp enough to permit detection of third order harmonics indicative of failure of the power transistors in the three phase inverter 18 without falsely generating a shut off signal when external power of a variable frequency is applied to the airframe. The tunable switched capacitor notched filter 66 has an advantage with respect to the prior art described above in that it is implementable in integrated circuit components which represents a substantial weight savings over that of the static notched filter 22 of FIG. 1 and which may be fabricated on the same substrate to minimize component ratio changes which can cause filter characteristic variation.

Figure 5:
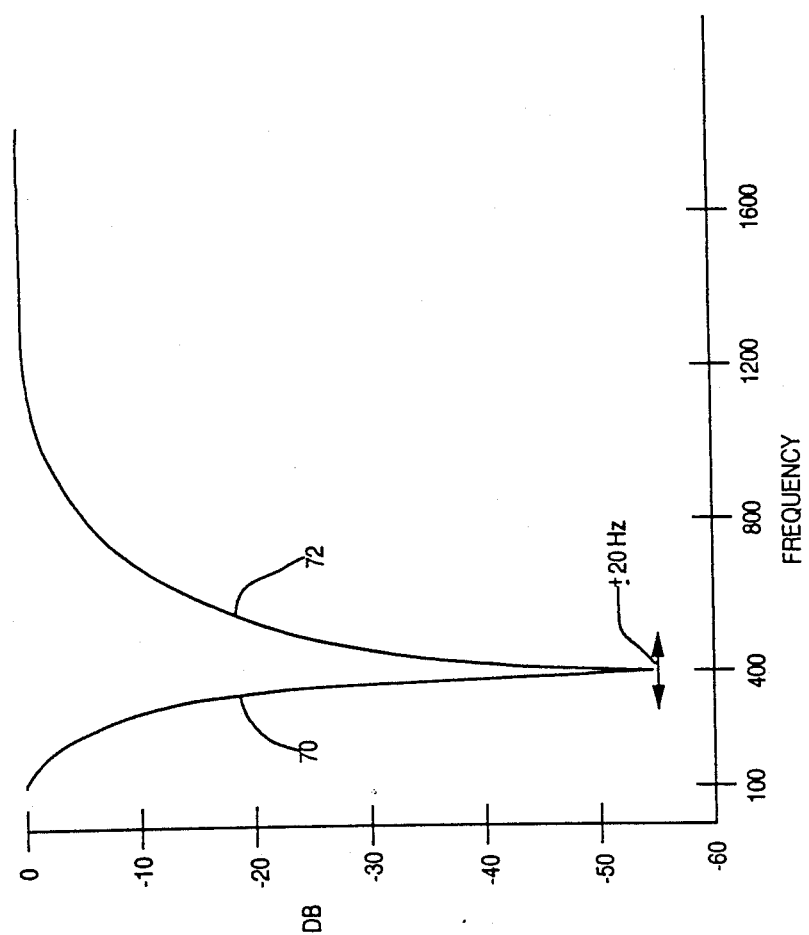
FIG. 5 illustrates a response characteristic of a notch filter in accordance with the present invention as applied to the embodiment of FIG. 4.

FIG. 5 illustrates a frequency response characteristic of the tunable switched capacitor notch filter 66 of FIG. 4. As illustrated, the maximum point of attenuation is approximately 55 decibels below the maximum response of the filter. Furthermore, the 35 db downpoint is approximately ±4 Hz. from the centerpoint of the frequency which is tunable over ±20 Hz. as indicated by the bidirectional horizontal arrow. The falling characteristic 70 is implemented by a second order switched capacitor filter including integrators and negative feedback and the rising characteristic 72 is implemented in a switched capacitor filter implemented with switched capacitors as described below with reference to FIG. 7. The tunable characteristic of ±20 Hz. of the maximum 55 db downpoint permits the filter to be implemented with two fewer stages than the fourth order filter present in the prior art of FIG. 1.

Figure 6:
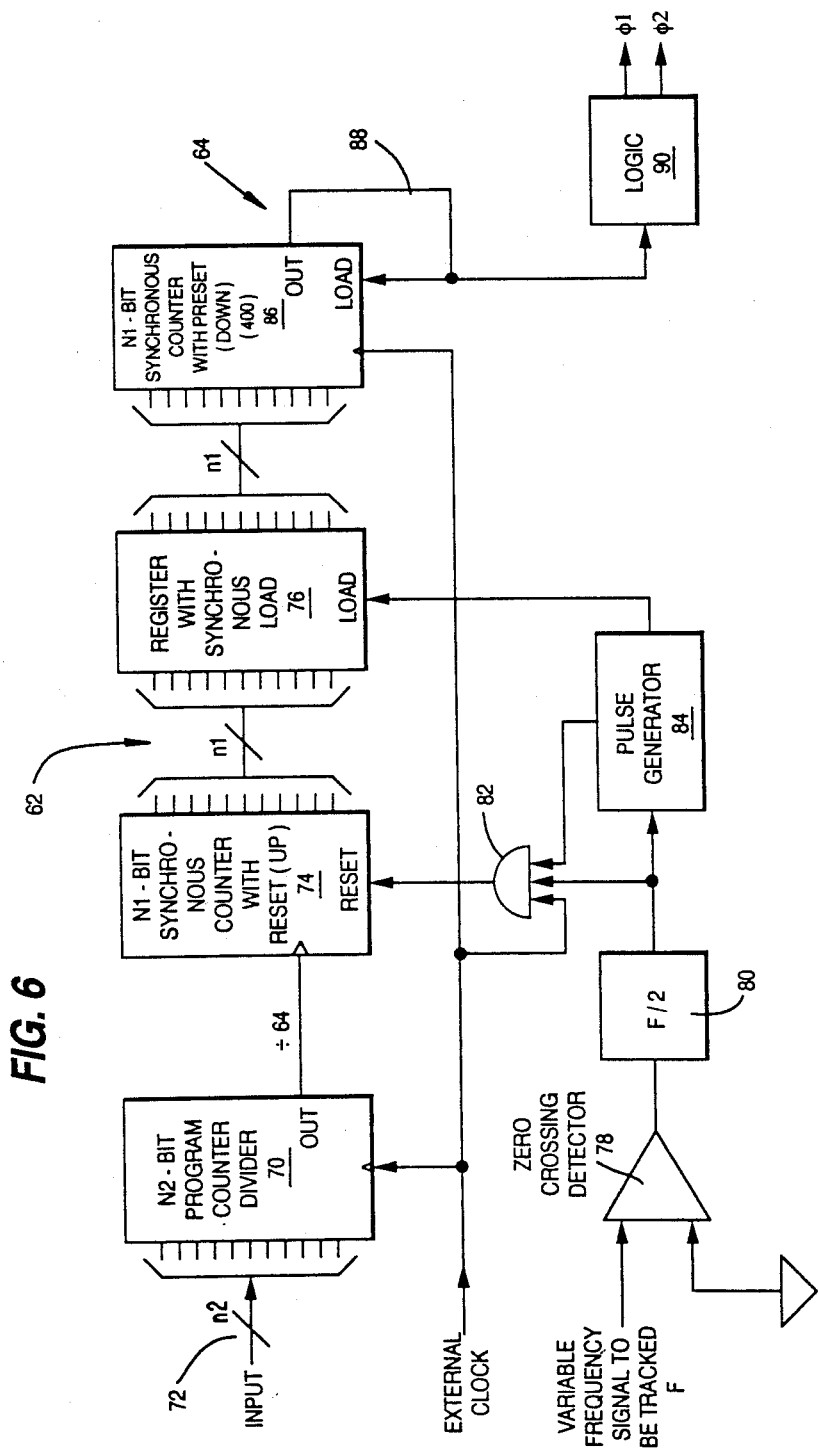
FIG. 6 illustrates a block diagram of the generation of the switching signals of the notch filter of the present invention.

FIG. 6 illustrates an implementation of the frequency detector 62 and switching signal generator 64 of FIG. 4. The frequency detector 62 and switching signal generator 64 may be implemented by integrated circuits and are based upon digital signal processing techniques which provides a high degree of accuracy.

The frequency detector 62 is comprised of a programmable counter divider 70, which is programmable to divide an external clock frequency by a divisor integer n which is programmed by input 72 to produce an output applied to an up counter 74, that is synchronized to count the number of output signals from the counter 70 occurring during a predetermined portion of the variable frequency signal to be tracked F such as a full cycle of every other cycle of the variable frequency signal; a storage register 76 which is loaded with the count counted by the counter 74; a zero crossing detector 78 which detects the basic frequency of the variable frequency signal, a divide by two circuit 80 which may be a flip-flop; AND gate 82 which generates the reset for counter 74 and pulse generator 84, which activates the loading of the storage register 76 with the count counted by counter 74.

The frequency detector 62 functions as follows. Input 72 permits the programming of the divider 70 of the divisor frequency n such that the output is a programmed divisor of the input external clock signal. The divisor may be a number such as 64. The up counter 74 counts the number of pulses outputted by the counter 70. Upon the elapsing of a time interval during which the counter 74 is counting which is at least a portion of a cycle of the signal F, the count storage register 76 is loaded with the count counted by counter 74. It should be understood that the count counted by counter 74 is inversely proportional to the frequency of the variable frequency signal to be tracked F which in the preferred embodiment is the frequency of power present on an airframe. In order to obtain maximum accuracy in the count stored in register 76, the counting is programmed to occur over every other cycle of the variable frequency signal. Zero crossing detector 78 produces an output signal which changes level each time the variable frequency signal passes through a zero point. Divide by two circuit 80 produces an output signal which changes level each time a cycle of the variable frequency signal has elapsed. AND gate 82 outputs a reset pulse once every other cycle of the variable frequency signal at the beginning of the cycle. The AND gate goes high only when the external clock signal, the output from the divide by two circuit 80 and the output from the pulse generator 84 are high.

Figure 3:
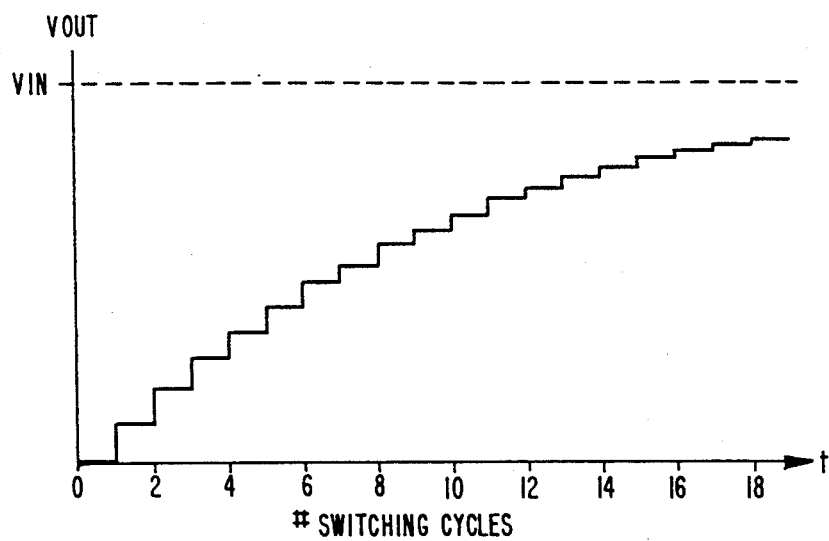
FIG. 3 illustrates the output characteristic of the filter of FIG. 2 as a function of a number of switching cycles.

The switching signal generator 64 is described as follows. A synchronous down counter 86 functions to load the count stored in the storage register 76 each time the output 88 goes low indicative of a zero count being reached. A high level signal outputted on line 88 is applied to a load input which initiates the count stored in storage register 76 being loaded. The counter 86 is preprogrammed by storage register 76 to count a number of external clock pulses such as 400 illustrated in parentheses. The frequency of the zero counts outputted on line 88 is directly proportional to the frequency of the variable frequency signal. Logic circuit 90 functions to output first and second switching signals Φ1 and Φ2 as illustrated in FIG. 4 which have a frequency identical to the frequency at which the counter 86 outputs zero counts. Furthermore, Φ2 is an inversion of Φ1. Appropriate choice of the count frequency and the relative ratio of the capacitances in the circuit schematic described below in FIG. 7 determines the filter characteristic in a manner analogous to the first order low pass filter described above with reference to FIG. 3.

Figure 2:
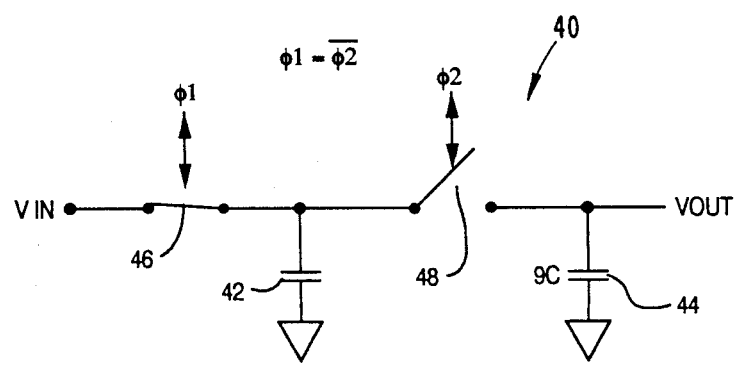
FIG. 2 illustrates a prior art first order low pass filter.
Figure 7:
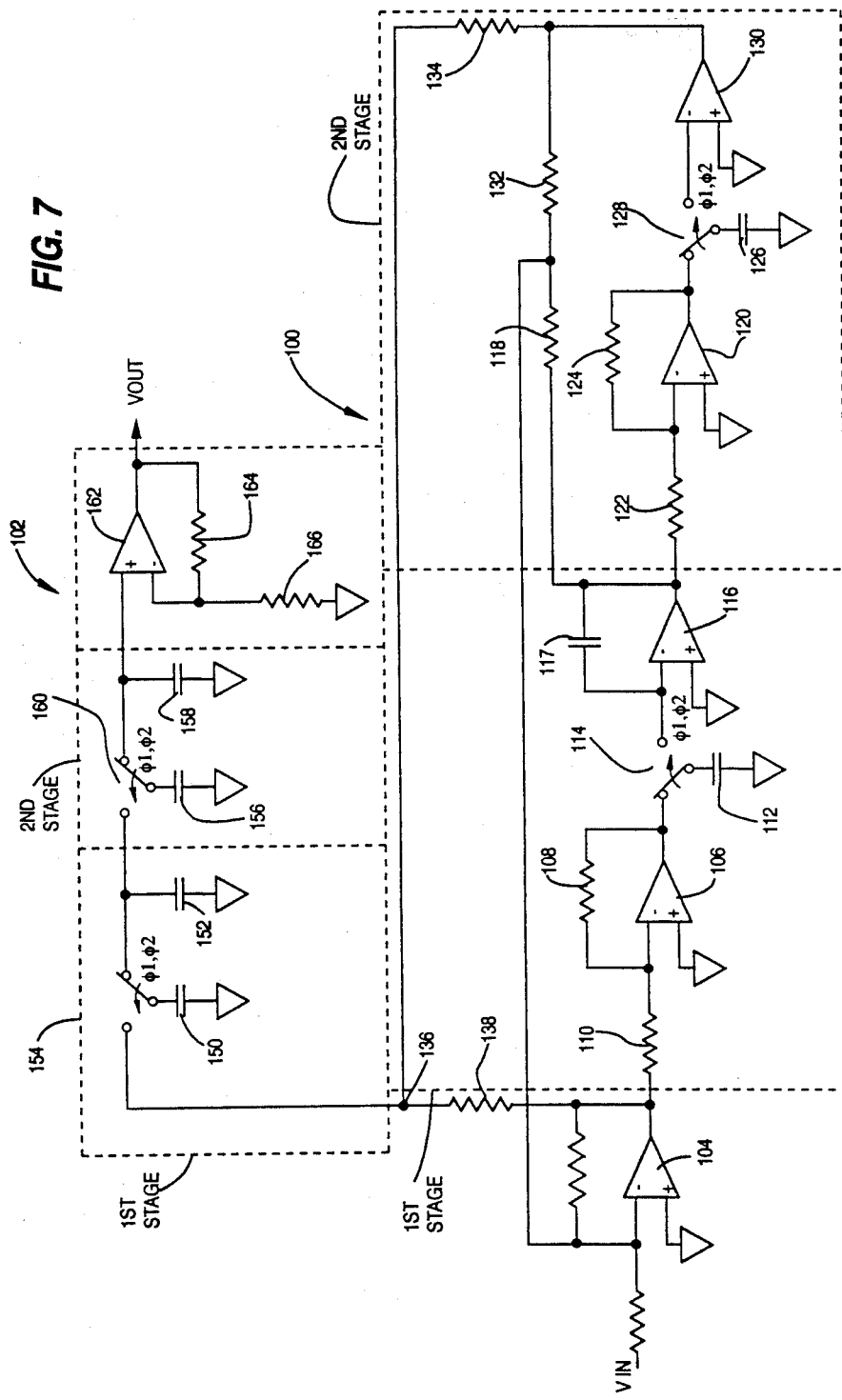
FIG. 7 illustrates a circuit schematic of the notch filter of the present invention having switches switched by the switching signals generated by FIG. 6.

FIG. 7 illustrates a circuit schematic of a filter implementing the response characteristic of FIG. 5. It should be understood that the schematic is only exemplary of the many forms in which a switched capacitor tunable notch filter may be implemented. The characteristic 70 of FIG. 5 is implemented in a switched capacitor filter 100 including integrator and negative feedback and the characteristic 72 of FIG. 5 is implemented in a switched filter 102. The switched capacitor filter 100 is connected in series with the switched capacitor filter 102 to give the combined characteristic illustrated in FIG. 5. Input amplifier 104 is provided for providing an appropriate reference level input to both the switched capacitor filters 100 and 102. Both switched capacitor filters are second order filters comprised of first and second stages. As indicated, a ground reference level is established by operation amplifier 104 but it should be understood that other reference levels such as several volts DC may be used in the alternative. The output of operational amplifier 104 is applied to operational amplifier 106 which inverts the output signal from amplifier 104. The gain of the operational amplifier 106 is determined by the ratio of the resistances 108 and 110. A first capacitor 112 has a first terminal connected to ground a second terminal connected to the switching circuit 114. The switching circuit 114 functions to alternately connect the second terminal of the capacitor 112 to the output of operational amplifier 106 and to the input of integrator 116 under the control of switching signals Φ1 and Φ2 as generated by the switching signal generator 64 of FIG. 6. Alternatively, the switching circuit 116 may be an electronically controlled single pole double throw switch on any design with the switching being synchronized by the output from counter 86. The output of integrator 116 is feedback to the input thereof through capacitor 117. It should be understood that in actuality the switching circuit 114 has a pair of switches which are switched under the control of the first and second switching signals Φ1 and Φ2 in a manner analogous to that illustrated in FIG. 2. The output of the integrator 116 is fed back by a negative feedback circuit including resistance 118 to the input of operational amplifier 104. The output of the integrator 116 is also applied to operational amplifier 120 through resistance 122. The gain of the operational amplifier 120 is determined by the ratio of the feedback resistance 124 and the resistance 122. A second capacitor 126 has a first terminal connected to ground and a second terminal which is alternately connected to the output of operational amplifier 120 by a second switching circuit 128 and to the input of operational amplifier 130. The second switching circuit 128 is identical to the first switching circuit 114 and functions in the same manner. The output of the operational amplifier 130 is fed back by a negative feedback circuit to the input of operational amplifier 120 through resistances 132 and 118. It should be noted that the switched filter 100 functions as a second order filter which produces the sharp response characteristics 70 of FIG. 5. The output of the switched filter 100 is applied through resistance 134 to summing point 136 where the output from the operational amplifier 104 is applied through resistance 138.

The switched capacitor filter 102 is comprised of first and second stages which are identical in form. The first stage includes a first capacitor 150 and a second capacitor 152 which each have first terminals coupled to ground. A switching circuit 154, which is identical to the switching circuits 114 and 128 described below, connects the second terminal of the capacitor 150 alternately to the input of the first stage and to the second terminal of the second capacitor 152 under the control of the first and second switching signals Φ1 and Φ2. The second stage has a first capacitor 156 and 158 which each have first terminals connected to ground. A second switching circuit 160, which is identical to the switching circuits 114, 128 and 154 discussed above, alternately connects the second terminal of the first capacitor 156 to the second terminal of capacitor 152 and to the second terminal of capacitor 158. Operational amplifier 162 amplifies the output from the second stage to a level sufficient to drive full-wave rectifier 24 as determined by the ratio of the resistances 164 and 166.

It should be further understood that while the invention has been described in terms of a notch filter, it is applicable to other types of filter characteristics, such as low pass and high pass filters which may be caused to track a variable frequency input signal. Furthermore, the invention may be implemented as a filter having a selectable order by series connection of multiple stages with the second order filters 100 and 102 only being exemplary of that which may be practiced with the invention. Furthermore, it should be understood that the field of application, while in the preferred embodiment being in the control of a three phase inverter in an airframe power supply, is applicable to diverse fields of application such as, but not limited to, communications.

While the invention has been described in terms of a preferred embodiment, it should be understood that numerous modifications may be made thereto without departing from the spirit and scope of the invention as defined in the appended claims. It is intended that all such modifications fall within the scope of the appended claims.

I claim:

1. A tunable filter having a filter characteristic tracking an input signal comprising:
    a signal source providing a variable frequency signal to be tracked by the filter characteristic;
    a frequency detector, coupled to the signal source, for producing a detector output signal which is a function of the frequency of the variable frequency signal;
    means, responsive to the frequency detector output signal, for generating at least one switching signal having a variable frequency proportional to the detector output signal;
    a first capacitor having a first terminal coupled to a reference potential and a second terminal; and
    first switching means, having an input coupled to the variable frequency signal, responsive to the at least one switching signal, and in response to changes in level of the at least one switching signal alternately coupling the input of the first switching means to the second terminal of the first capacitor and coupling the second terminal of the first capacitor to an output of the first switching means coupled to an output of the filter.

2. A tunable filter in accordance with claim 1 wherein:
    the output of the first switching means is coupled to an integrator.

3. A tunable filter in accordance with claim 2 further comprising:
    a negative feedback circuit coupled between an output of the integrator and the input of the switching means.

4. A tunable filter in accordance with claim 1 further comprising:
    a second capacitor having a first terminal coupled to a reference potential and a second terminal, the first switching means coupling the output of the first switching means to the second terminal of the second capacitor which is coupled to the output of the filter when the second terminal of the first capacitor is coupled to the output of the first switching means.

5. A tunable filter in accordance with claim 4 further comprising:
    a third capacitor having a first terminal coupled to a reference potential and a second terminal; and
    second switching means, having an input coupled to the variable frequency signal, responsive to the at least one switching signal, and in response changes in level of the at least one switching signal alternately coupling the input of the second switching means to the second terminal of the third capacitor and coupling the second terminal of the third capacitor to the output of the filter.

6. A tunable filter in accordance with claim 5 wherein:
the output of the first switching means is coupled to an integrator.

7. A tunable filter in accordance with claim 6 further comprising:
a negative feedback current coupled between an output of the integrator and the input of the second switching means.

8. A tunable filter in accordance with claim 7 wherein:
the filter contains a series circuit having an input coupled to the signal source and an output which is the output of the filter, the series circuit containing the first and second switching means, the first, second and third capacitors, the integrator and the negative feedback circuit.

9. A tunable filter in accordance with claim 1 wherein:
the signal source is AC power on an airframe; and
the filter is a notch filter having a maximum attenuation point which tracks the AC power frequency.

10. A tunable filter further in accordance with claim 9 comprising:
a three phase inverter for generating the AC power, the inverter stopping generating electrical power in response to a shutdown signal;
means, responsive to an output of the notch filter, for rectifying any signal frequencies passed by the filter;
means for comparing the rectified signal frequencies with a reference magnitude and generating the shutdown signal if the recitified signal magnitude exceeds the reference magnitude, the shutdown signal being coupled to the three phase inverter.

11. A tunable filter in accordance with claim 1 wherein:
the means for generating the at least one switching signal generates first and second switching signals, the first and second switching signals each alternating between first and second levels and the second switching signal being an inversion of the first switching signal; and
the first switching means comprises first and second switches, the first switch having a first, second and control terminals with the first terminal being connected to the second terminal in response to a first level of the first switching signal being applied to the control terminal and the first terminal being disconnected from the second terminal in response to the second level of the first switching signal being applied to the control terminal, the first terminal being coupled to the signal source and the second terminal being coupled to the second terminal of the first capacitor, the second switch having first, second and control terminals with the first terminal of the second switch being coupled to the second terminal of the first capacitor, the second terminal of the second switch being coupled to the output of the filter and the control terminal of the second switch being coupled to the second switching signal, the first terminal of the second switch being connected to the second terminal of the second switch in response to a first level of the first switching signal being applied to the control terminal of the second switch and the first terminal of the second switch being disconnected from the second terminal of the second switch in response to a second level of the second switching signal being applied to the control terminal of the second switch.

12. A tunable filter in accordance with claim 3 wherein:
the first capacitor, the first switching means, the integrator, and negative feedback circuit are a stage of the filter and the filter contains a plurality of stages connected in series to form a multiple order filter with each stage having the first capacitor, the first switching means, the integrator and the negative feedback circuit.

13. A tunable filter in accordance with claim 4 wherein:
the first capacitor, second capacitor and the first switching means are a stage of the filter and the filter contains a plurality of stages connected in series to form a multiple order filter with each stage having the first and second capacitors and the first switching means.

14. A tunable filter in accordance with claim 7 wherein:
the first capacitor, second capacitor and the first switching means are a first stage of the filter;
the third capacitor, the second switching means, the integrator, and the negative feedback circuit are a second stage of the filter; and
the filter contains a plurality of first stages and a plurality of second stages connected in series to form a multiple order filter.

15. A tunable filter in accordance with claim 1 wherein the means for generating the at least one switching signal comprises:
a clock for providing clock pulses;
means, responsive to the clock and to the signal source, for counting a number of pulses occurring during at least a portion of a cycle of the sign variable frequency signal from the signal source with the pulses being synchronous with the clock pulses with the count being a function of the frequency of the variable frequency signal;
means, coupled to the means for counting, for storing the number of pulses counted during at least a portion of a cycle of the variable frequency signal; and
a down counter, coupled to the means for storing and to the clock, for cyclically loading the down counter with the stored count each time the down counter counts to zero and counting down in response to each clock pulse until zero is reached and producing the at least one switching signal in response to each time the down counter counts to zero.

16. A tunable filter in accordance with claim 15 further comprising:
means, responsive to each zero count, for producing first and second switching signals having a frequency determined by a frequency of zero counts produced by the down counter with the second switching signal being an inversion of the first switching signal.

17. A tunable filter in accordance with claim 15 wherein the means for counting a number of clock pulses during at least a portion of a cycle of the variable frequency signal comprises:
- a divider, responsive to the clock, for dividing the clock signal by an integer n to produce an output signal having a frequency which is equal to the clock frequency divided by n; and
- an up counter responsive to the output signal of the divider, which is reset each time a predetermined at least a portion of a cycle of the variable frequency signal occurs and which counts the output pulses outputted by the divider during the predetermined at least a portion of the cycle of the variable frequency signal to generate the number of pulses stored by the means for storing.

18. A tunable filter in accordance with claim 17 further comprising:
- a zero crossing detector responsive to the variable frequency signal, for producing an output signal having a period proportional to the frequency of the variable frequency signal, the up counter being set in response to the output signal from the zero crossing detector.

19. A tunable filter in accordance with claim 18 further comprising:
- means, coupled to the output signal from the zero crossing detector, for producing a control signal having one-half a frequency of the variable frequency signal; and wherein
- the up counter is reset as a function of the control signal.

20. A tunable filter in accordance with claim 19 further comprising:
- a pulse generator, responsive to the control signal, for producing an output pulse each time the control signal changes from a first level to a second level, the output pulse causing the storage of the count of the number of pulses in the means for storing; and
- a gate, having first, second and third inputs and an output which resets the up counter, the first input being from the clock, the second input being from the control signal and the third input being from the pulse generator.

21. A tunable filter in accordance with claim 10 wherein the means for generating the at least one switching signal comprises:
- a clock for providing clock pulses;
- means, responsive to the clock and to the signal source, for counting a number of pulses occurring during at least a portion of a cycle of the sign variable frequency signal from the signal source with the pulses being synchronous with the clock pulses with the count being a function of the frequency of the variable frequency signal;
- means, coupled to the means for counting, for storing the number of pulses counted during at least a portion of a cycle of the variable frequency signal; and
- a down counter, coupled to the means for storing and to the clock, for cyclically loading the down counter with the stored count each time the down counter counts to zero and counting down in response to each clock pulse until zero is reached and producing the at least one switching signal in response to each time the down counter counts to zero.

22. A tunable filter in accordance with claim 21 further comprising:
- means, responsive to each zero count, for producing first and second switching signals having a frequency determined by a frequency of zero counts produced by the down counter with the second switching signal being an inversion of the first switching signal.

23. A tunable filter in accordance with claim 21 wherein the means for counting a number of clock pulses during at least a portion of a cycle of the variable frequency signal comprises:
- a divider, responsive to the clock, for dividing the clock signal by an integer n to produce an output signal having a frequency which is equal to the clock frequency divided by n; and
- an up counter responsive to the output signal of the divider, which is reset each time a predetermined at least a portion of a cycle of the variable frequency signal occurs and which counts the output pulses outputted by the divider during the predetermined at least a portion of the cycle of the variable frequency signal to generate the number of pulses stored by the means for storing.

24. A tunable filter in accordance with claim 23 further comprising:
- a zero crossing detector, responsive to the variable frequency signal, for producing an output signal having a period proportional to the frequency of the variable frequency signal, the up counter being set in response to the output signal from the zero crossing detector.

25. A tunable filter in accordance with claim 24 further comprising:
- means, coupled to the output signal from the zero crossing detector, for producing a control signal having one-half the frequency of the variable frequency signal; and wherein
- the up counter is reset as a function of the control signal.

26. A tunable filter in accordance with claim 25 further comprising:
- a pulse generator, responsive to the control signal, for producing an output pulse each time the control signal changes from a first level to a second level, the output pulse causing the storage of the count of the number of pulses in the means for storing; and
- a gate, having first, second and third inputs and an output which resets the up counter, the first input being from the clock, the second input being from the control signal and the third input being from the pulse generator.

27. A tunable filter in accordance with claim 14 wherein the means for generating at least one switching signal comprises:
- a clock for providing clock pulses;
- means, responsive to the clock and to the signal source, for counting a number of pulses occurring during at least a portion of a cycle of the sign variable frequency signal from the signal source with the pulses being synchronous with the clock pulses with the count being a function of the frequency of the variable frequency signal;
- means, coupled to the means for counting, for storing the number of pulses counted during at least a portion of a cycle of the variable frequency signal; and a down counter, coupled to the means for storing and to the clock, for cyclically loading the down counter with the stored count each time the down counter counts to zero and counting down in response to each clock pulse until zero is reached and producing the at least one switching signal in response to each time the down counter counts to zero.

28. A tunable filter in accordance with claim 27 further comprising:
means, responsive to each zero count, for producing first and second switching signals having a frequency determined by a frequency of zero counts produced by the down counter with the second switching signal being an inversion of the first switching signal.

29. A tunable filter in accordance with claim 27 wherein the means for counting a number of clock pulses during at least a portion of a cycle of the variable frequency signal comprises:
a divider, responsive to the clock, for dividing the clock signal by a number n to produce an output signal having a frequency which is equal to the clock frequency divided by n; and
an up counter responsive to the output signal of the divider, which is reset each time a predetermined at least a portion of a cycle of the variable frequency signal occurs and which counts the output pulses outputted by the divider during the predetermined at least a portion of the cycle of the variable frequency signal to generate the number of pulses stored by the means for storing.

30. A tunable filter in accordance with claim 29 further comprising:
a zero crossing detector, responsive to the variable frequency signal, for producing an output signal having a period proportional to the frequency of the variable frequency signal, the up counter being set in response to the output signal from the zero crossing detector.

31. A tunable filter in accordance with claim 30 further comprising:
means, coupled to the output signal from the zero crossing detector, for producing a control signal having one-half the frequency of the variable frequency signal; and wherein
the up counter is reset as a function of the control signal.

32. A tunable filter in accordance with claim 31 further comprising:
a pulse generator, responsive to the control signal, for producing an output pulse each time the control signal changes from a first level to a second level, the output pulse causing the storage of the count of the number of pulses in the means for storing; and
a gate, having first, second and third inputs and an output which resets the up counter, the first input being from the clock, the second input being from the control signal and the third input being from the pulse generator.

* * * * *